United States Patent [19]
Kempf

[11] Patent Number: 5,800,687
[45] Date of Patent: Sep. 1, 1998

[54] DEVICE FOR MASKING OR COVERING SUBSTRATES

[75] Inventor: Stefan Kempf, Alzenau-Albstadt, Germany

[73] Assignee: Singulus Technologies GmbH, Alzenau, Germany

[21] Appl. No.: 834,142

[22] Filed: Apr. 14, 1997

[51] Int. Cl.⁶ .................................................. C23C 14/34

[52] U.S. Cl. ................... 204/298.11; 204/298.09; 204/298.12; 204/298.14; 204/298.15

[58] Field of Search ............... 204/298.07, 298.09, 204/298.11, 298.12, 298.14, 298.15; 118/721

[56] References Cited
FOREIGN PATENT DOCUMENTS
2 286 201 of 0000 United Kingdom.

*Primary Examiner*—R. Bruce Breneman
*Assistant Examiner*—Rodney G. McDonald
*Attorney, Agent, or Firm*—Pillsbury Madison & Sutro

[57] ABSTRACT

A device including a sputtering cathode 2 and masks for masking or covering portions of a surface of a substrates 27, having a center mask guide element 56 on which a center mask 26, which covers the substrate 27, is disposed and works together with an outer mask 4 in such a way that only the uncovered part of the substrate 27 is coated during the coating process. The inner and/or the outer masks 4, 26 can be adjusted independently of each other along a longitudinal center axis 58 of the device.

20 Claims, 2 Drawing Sheets

DEVICE FOR MASKING OR COVERING SUBSTRATES

BACKGROUND OF THE INVENTION

The present invention relates to a device utilizing a sputtering cathode for masking or covering substrates, the device having a center mask guide element on which a center mask, which covers the substrate, is disposed and works together with an outer mask in such a way that only the uncovered part of the substrate is coated during the coating process.

A device for cathode sputtering of disk-shaped substrates of the type mentioned at the outset is disclosed in DE 43 15 023 Al, Cl. C 23 C 14/35. This device generates a plasma in a vacuum or process chamber provided with at least one opening which can be closed from the outside by placing a sputtering cathode on it, wherein an elastic seal ring is provided between the cathode and a chamber wall. It is possible to mask a compact disc (CD) at its inner and outer diameters with this device, so that only defined portions of the surface of the CD are coated. It is intended to coat defined surface areas of the CD by means of this device in such a way that a well defined boundary between the coated surface areas and the uncoated or metallized surface areas of the CD is achieved. To this end the CD is pressed against the outer and inner edges of the inner and outer masks. The necessary simultaneous pressing against two different components is complicated and difficult because of height differences and requires very tight manufacturing tolerances.

GB-A-2286201 discloses a magnetron sputtering apparatus with an inner and an outer mask with a common alignment with respect to the CD.

BRIEF SUMMARY OF THE INVENTION

Accordingly an object of the invention is to provide a device which enables distinctly defined surface areas of a CD to be coated in such a way that a well defined boundary between the coated surface areas and the uncoated or metallized surface areas of the CD is achieved, wherein the substrate or the CD is adjusted in such a way that height differences can be easily compensated.

This and other objects are attained in accordance with the invention in that the inner and/or the outer masks can be adjusted independently of each other. Since it is possible to adjust the inner and outer masks of the sputtering cathode independently in respect to the substrate, they can be pressed against the surface of the substrate with an even contact pressure, so that exact and defined surfaces are created which are not coated by cathode sputtering. By means of the even contact pressure of the two masks it is achieved that no coating material gets underneath the masks or into the space between the underside of the masks and the surface of the substrate or the CD.

In this way it is also possible to compensate manufacturing tolerances to a large extent, so that even with masks of different lengths the two masks are located on the same transverse plane in their final position, i.e. when they rest on the surface of the substrate.

It is furthermore advantageous that the inner, or center, mask can be adjusted independently of the outer mask in the device for coating the substrate as a function of the gas pressure. By means of the employment of the gas pressure prevailing in the device, it is possible to adjust the center mask in the direction of the substrate, so that the substrate is used in a compulsory manner for adjusting the center mask always at the time when the substrate is moved in the direction of the masks. By means of the individual adjustment of the center mask it is also possible to initially move the center mask in the direction of the surface of the substrate, or the center mask can be moved into a position in respect to the outer mask in which the center mask slightly protrudes in relation to the outer mask. By means of this it is assured that first the center mask comes to rest against the surface of the substrate, which then, in the course of adjusting the substrate in the direction of the center mask, subsequently also comes to rest against the outer mask, so that then both masks create a surface which can be exactly defined and is freed for coating.

In accordance with a further development of the device of the invention there is an additional option that, independently of the outer mask, the center mask can be adjusted in the device as a function of the differential pressure in the direction of the substrate and/or in the direction of the longitudinal center axis of the device or the cathode. It is possible in a cost-effective manner to employ the differential pressure for adjusting the center mask in relation to the surface, so that additional adjustment members can be omitted. In this way it is assured that the center mask always is the first to come to rest against the surface of the substrate. If the substrate is further adjusted upward or in the direction toward the two masks, the outer edge of the substrate subsequently comes to rest against the outer mask. By means of this an even contact pressure of both masks against the surface of the substrate is achieved.

In further development of the invention it is advantageous that the differential pressure force $F_{df}$ in the device is determined by the exterior diameter of the adjustable portion of the holder which is arranged coaxially with the longitudinal center axis of the cathode.

In accordance with a preferred embodiment of the attainment of the object of the invention it is finally provided that the differential pressure diameter $P_d$ is situated in the area of a diaphragm or is determined by the inner diameter of the diaphragm in the assembled state which seals the vacuum chamber of the device against the chamber in which the atmospheric pressure prevails, and that the center mask consists of a plate-shaped mask element which is disposed on a cylinder-shaped cooling housing, the latter being arranged on the center mask guide element or a cantilever arm and being adjusted by means of the latter in relation to the differential pressure.

It is of particular importance for the instant invention that the plate-shaped center mask element can be adjusted between two adjustable stops dependently or independently of the adjustment path of the cantilever. It is possible by means of the independent adjustment of the plate-shaped center mask element in relation to the outer mask element to use the differential pressure as an adjustment device for the center mask element, so that separate adjustment elements for adjusting the center mask element and for assuring an even contact pressure of both mask elements can be omitted.

It is furthermore advantageous that the plate-shaped mask center element is releasably connected with the cylinder-shaped housing or the cooling housing, is disposed concentrically in respect to the longitudinal center axis and is releasably coaxially connected with the cooling housing.

To this end it is advantageous that the cooling housing is releasably connected to the center mask guide element and its adjusting movement can be limited by at least one stop. The lift path of the center mask is limited by the adjustably embodied stops and damage to the diaphragm is prevented in this way.

In accordance with a further development of the device of the invention there is the additional option that the center mask guide element can be adjusted between two stops and that the stops are adjustable.

It is advantageous in a further embodiment of the invention that the stops are disposed on the center mask guide element or on a cantilever arm which receives the center mask guide element, and that the diaphragm, the cooling housing and/or the center mask seal the chamber with atmospheric pressure $P_a$ in respect to the chamber with the vacuum pressure or the vacuum chamber.

It is achieved in this way that the diaphragm consists of a cylinder-shaped element or center piece, to the ends of which respectively one flange is connected which is releasably received in respectively one clamping device, that the center mask can be adjusted in relation to the clamping device or the nonadjustable elements of the device or the outer mask, and that in the initial position, in which the masks are disposed at a distance from the surface of the substrate, the center mask protrudes in respect to the surface of the outer mask in such a way that the center mask comes first to rest on the surface of the substrate when the latter is moved in the direction toward the center mask.

A further advantage is that the outer mask and/or the lower part of the center mask are releasably connected and the outer mask and/or the lower part of the center mask come to rest against the surface of the substrate with approximately the same contact pressure.

It is furthermore advantageous that the center mask guide element, the cantilever arm or the element which guides or adjusts the center mask guide arm are provided in a chamber which is continuously under an atmospheric pressure $P_1$.

Further advantages and details of the invention are described below and illustrated in the drawings.

DETAILED DESCRIPTION OF THE INVENTION

Figure 1:
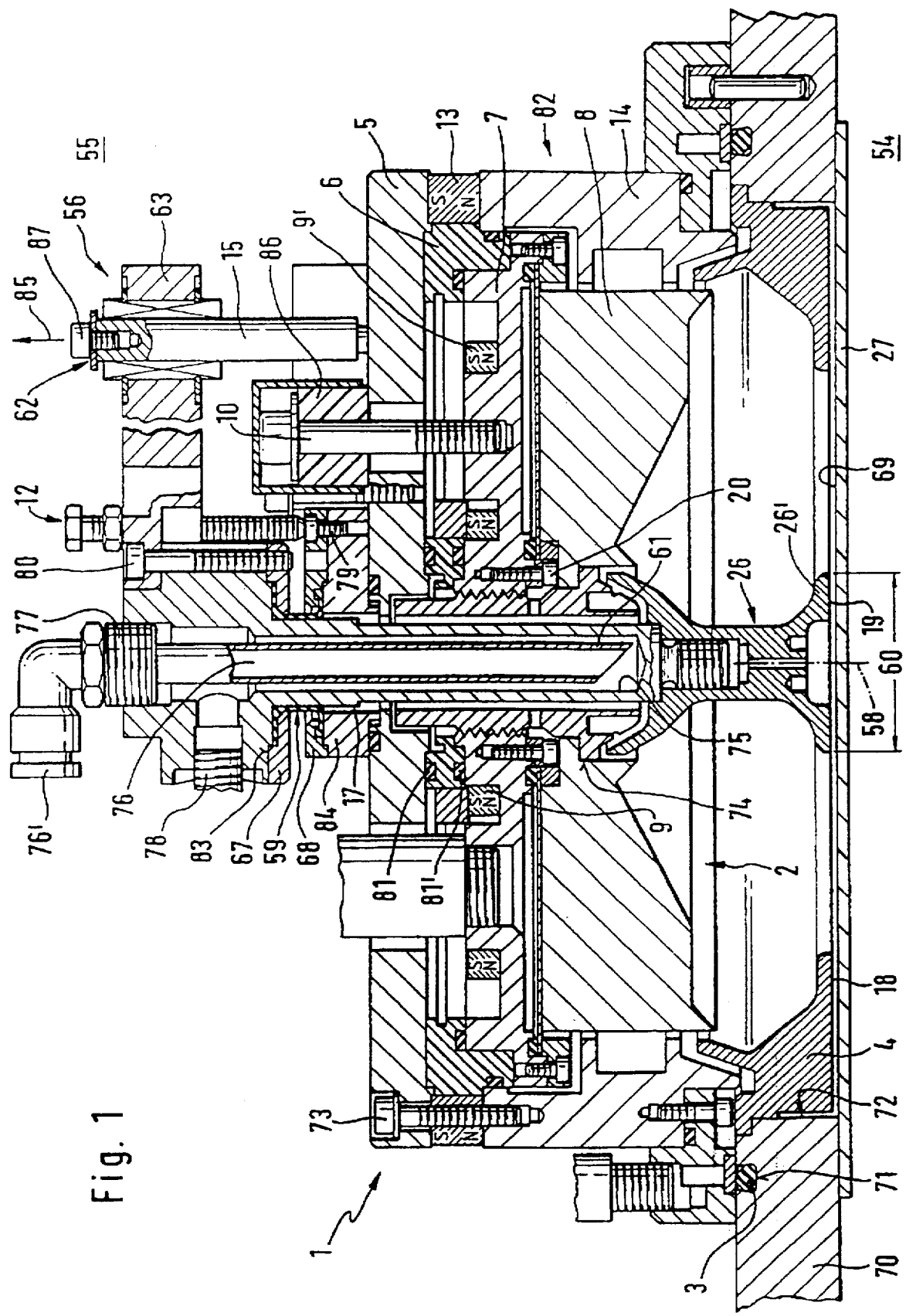
FIG. 1 is a cross-sectional, elevational view of a device according to an embodiment of the invention having a sputtering cathode and an individually adjustable center mask.

A device for coating substrates, such as CD 27 is represented by 1 in the drawings, part of which device is a sputtering cathode 2.

The sputtering cathode 2 has been placed on a chamber wall 70 which, according to the drawings, is fixed in place. A ring-shaped groove 71 for receiving a vacuum seal 3 is present in the chamber wall 70. The chamber wall 70 has a circular opening 72, into which an outer mask 4 and a center mask 26 can extend.

The sputtering cathode 2 consists of a disk-shaped ferromagnetic yoke 5 and a cooling plate 7. A disk-shaped insulator 6 is inserted between the yoke 5 and the cooling plate 7. The yoke 5 as well as the cooling plate 7 are surrounded by a pole shoe 82, which is releasably connected with the yoke 5 by means of threaded bolts 73, one of which is visible in FIG. 1.

Referring to the drawings, a target 8 which is to be a sputtering source is located below the cooling plate 7 and is inserted into an annular chamber enclosed by the pole shoe 14 and is indirectly secured in the cooling plate 7 by means of a screw element or a female screw 20.

Ring-shaped grooves for ring magnets 9 and 9' are also provided on the rear of the cooling plate 7. The yoke 5, the insulator 6 and the cooling plate 7 are held together by a screw 10, wherein the screw 10 is insulated from the yoke 5 by an insulator 86 and is connected with a sputtering current supply device, not shown, by means of a cable, not shown in the drawings.

A ring magnet 13 with the associated pole shoe 14 is situated in the area of the outer, radially extending front face of the yoke 5.

As can be further seen in the drawings, an axial bore 74 is provided in the interior area of the cathode 2 and extends from the rear of the yoke 5 to as far as the front of the target 8. A center mask 26 (center anode) with an adjoining cooling housing 61 is located in this axial bore 74. Cooling housing 61 is hollow and has a center bore. A cooling line 76, which is provided with a connector 76', is housed in the center bore. Cooling water can enter through the connector 76' and the line 76 provided in the bore 75 of the cooling housing 61 and can then be removed to the outside via an annular passage, defined between the cooling line 76 and the center bore 75 of the cooling housing, and an outlet opening 78.

The cooling housing 61 which extends through the bore 74 is connected in its upper area with each cantilever arm 63 (a second parallel cantilever arm is not shown) by means of threaded bolts 80 and can be adjusted by a screw 12 forming a lower stop in the direction of a longitudinal center axis 58. A threaded coupler 77 connects the cooling line 76 and connector 76' to the housing 61. The two cantilever arms 63 are arranged in parallel and integrally connected to the upper area or head of the cooling housing 61. Depending on the weight of the device, a single cantilever could be also sufficient.

Figure 2:
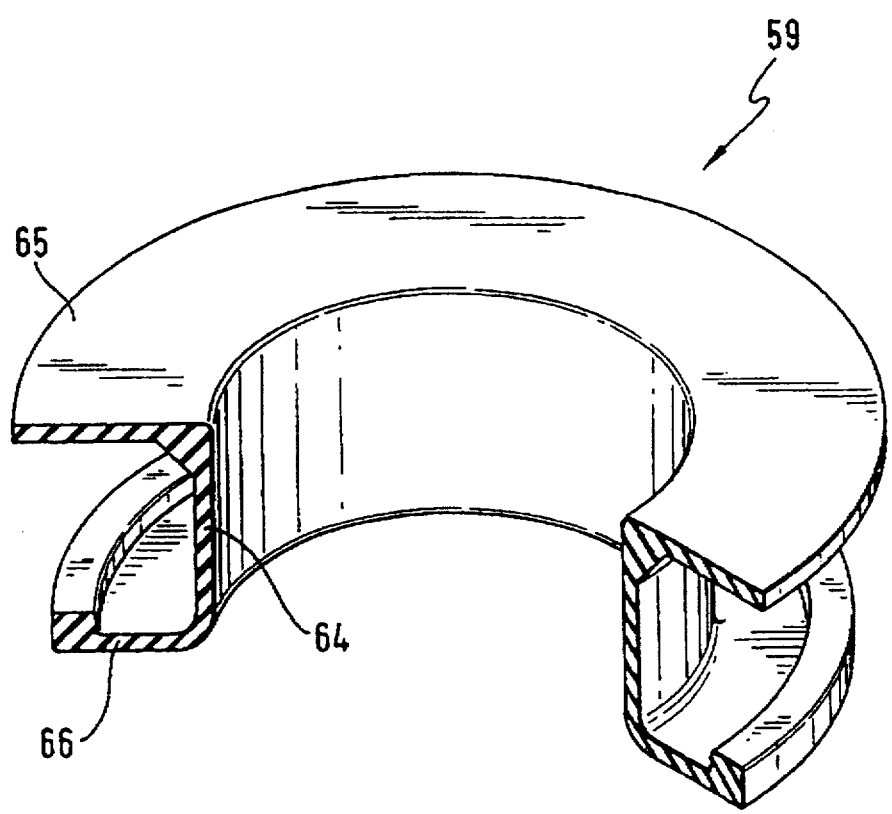
FIG. 2 is a cut-away, perspective view of a diaphragm used in the device of FIG. 1.

A chamber 55, which is under atmospheric pressure $P_a$, is sealed against a vacuum chamber 54. Sealing is effected, among others, by the cylindrical cooling housing 61 and a diaphragm 59. Diaphragm 59 is shown in FIG. 2 and consists of a hollow cylindrical element or center piece 64 and two annular flanges 65 and 66 fixed to, or integral with, respective end of center piece 64. The flanges 65, 66 extend at right angles in respect to the center piece 64 and are secured in place by means of clamping devices 67 and 68, as shown in FIG. 1. The upper clamping device 67 rests against a front face 83 of the cantilever arm 63, and the lower clamping device 68 rests against a holder 84; the clamping device 68 and the holder 84 are connected by means of a screw 79 and a further screw with the yoke 5. Clamping device 68 is connected with the holder 84 by means of threaded bolts 79. The upper clamping device 67 is connected with the cantilever arm 63 by means of threaded bolts 80. By means of this the upper chamber 55 is sealed against the vacuum chamber 54. Further sealing elements 81, 81' are located in corresponding annular grooves provided in the sputtering cathode 2, and specifically in insulator 6.

The cantilever arms 63 are indirectly disposed on the yoke 5 each by means of a fixed slide column 15 and a slide bearing 82, each of which is fixed to the respective cantilever arm 63 and movable along the respective column 15, so that the cantilever arm, 63 can be displaced upwardly or downwardly in the direction of the arrow 85. The displacement path of the cantilever arm 63 as well as the center mask 26, which is vertically movable with the cantilever arm 63, extends between an upper stop 62 and the lower stop 12. The upper stop 62 consists of a screw 87 with a stop plate, screw 87 being screwed into the upper end of slide column 15. The lower stop 12 is formed by a fastening screw with a locking nut, the fastening screw extending through the cantilever arm 63 and coming to rest against the top of clamping device 68, or more specifically the top of screw 79. The adjustment path of the center mask 26 and the associated cooling housing 61 as well as of the cantilever arm 63 thus is limited by the two stops 62 and 12 and is located in the range of longitudinal stretching of the diaphragm 59, so that damage to the diaphragm 59 by movement between the two stops is prevented.

If atmospheric pressure $P_a$ prevails in the upper chamber 55 and an underpressure, or a pressure lower than the pressure $P_a$, prevails in the vacuum chamber 54 including the sputter chamber between the cathode 8 and substrate 27, a differential pressure force $F_{dif}$ (see cylinder portion 64' of the cooling housing 61 contacting the inner surface of the center piece 64 of the diaphragm 53) is generated, which is determined by an annular surface 17 which results from the exterior diameter of the cooling housing 61 in accordance with the drawings. The differential pressure force $F_{dif}$ therefore causes an adjustment movement of the center mask 26 in the direction toward the surface of a substrate 27. The adjustment path of the center mask 26 has been selected to be such that in the initial position, in which the masks are arranged at a distance from a surface 69 of the substrate 27, the front face 19 of the center mask 26 protrudes below the surface or front face 18 of the outer mask 4 in such a way that the center mask 26 comes to rest first on the surface 69 of the substrate 27 when the substrate 27 located on a vertically movable carrier 88 is moved towards the center mask 26. During said movement of the carrier 88 (see the arrow 89), the substrate 27 centered on the carrier 88 by means of the pin 90 engaging the center hole 91 of the substrate 27, contacts the center mask 26 and, subsequently, the substrate 27 acts against the adjusting pressure or the differential pressure force $F_{dif}$ and displaces the center mask 26 upward until the edge area of the CD or the substrate 27 comes to rest against a front face 18 of the outer mask 4. In the course of an upward lifting movement of the substrate 27, an approximately equal contact pressure at both masks and thus defined cover areas, which cannot be coated, are generated on the surface of the substrate 27 because of the advantageous arrangement of the outer mask 4 and the center mask 26.

Although not shown in the drawings, there is also the option to mount the outer mask for vertical adjustment in a similar manner.

To this end, in the exemplary embodiment the center mask 26 is formed by a plate-shaped mask element 60, which is releasably disposed on the cylinder-shaped cooling housing 61, housing 61, in turn, being disposed on a center mask guide element 56. The cantilever arm 63 is part of the center mask guide element 56.

As can be seen from the drawings, the plate-shaped mask element 60, or a lower part 26' of center mask 26, can be releasably connected with the cylinder-shaped housing or the cooling housing 61, as by a threaded shank, so that the plate-shaped mask element 60 can be replaced at any time, for example if it has been coated with aluminum.

In an advantageous manner the plate-shaped mask element 60 is disposed here concentrically with the longitudinal center axis 58 and with the cooling housing 61.

The cooling housing 61 can also be releasably connected with the center mask guide element 56.

It is also possible for the outer mask 4 to be releasably connected with the chamber wall 70.

It is furthermore also advantageous to embody the cantilever arm 63, the center mask guide element 56, the cooling housing 61, the diaphragm 59 with its clamping devices 67, 68, the holder 84 as well as the two slide columns 15 as a pre-assembled structural component, which is releasably connected by means of the screw 87 with the yoke 5. Because of this there is the possibility of providing a horizontal adjustment in respect to the yoke 5 after the screw 87 has been loosened and the concentricity of the center and outer masks has been achieved. By means of this the center axis 58 of the diaphragm 59 is always kept constant in relation to the center axis of the component, since the diaphragm 59 is integrated in the structural component.

This application relates to subject matter disclosed in German Application number 196 14 600.3, filed on Apr. 13, 1996, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A device comprising a sputtering cathode (2) and masking means for masking or covering first portions of a surface of a substrate (27) when the substrate is in position to have a second portion of the surface of the substrate coated by material emitted from said sputtering cathode, wherein said masking means comprise: a center mask (26) for masking one first portion of the substrate surface; a center mask guide element (56) supporting said center mask; an outer mask (4) for masking another first portion of the substrate surface; and displacement means coupled to at least one of said masks for effecting relative displacement of one of said masks relative to the other one of said masks.

2. The device in accordance with claim 1, wherein the center mask can be adjusted independently of the outer mask as a function of a gas pressure in said device.

3. The device in accordance with claim 2, wherein the center mask can be adjusted independently of the outer mask as a function of a differential pressure in the device along a longitudinal center axis (58) of the device.

4. The device in accordance with claim 3, wherein the center mask guide element comprises a cooling housing (61) which supports the center mask, is aligned with the longitudinal center axis (58) of the device, and has an outer diameter, and the differential pressure force $F_{dif}$ in the device is determined by the outer diameter of the cooling housing.

5. The device in accordance with claim 4, further comprising a vacuum chamber (54); a second chamber (55) in which atmospheric pressure prevails; and a diaphragm (59) providing a seal between the vacuum chamber and the second chamber, the diaphragm having an inner diameter which defines a differential pressure diameter $P_d$.

6. The device in accordance with claim 5, wherein the diaphragm and one of the cooling housing and the center mask seal the second chamber from the vacuum chamber.

7. The device in accordance with claim 5, wherein the diaphragm comprises a hollow cylindrical element having two axial ends, and two annular flanges each connected to a respective axial end, and the device further comprises two clamping devices each holding a respective annular flange in place in such a way that the center mask can be adjusted with respect to one of the clamping devices.

8. The device in accordance with claim 1, further comprising a cylindrical cooling housing (61) which is disposed on the center mask guide element and can be adjusted together with the center mask guide element in response to a differential pressure, and wherein the center mask comprises a plate-shaped mask element (60) carried by the cylindrical cooling housing.

9. The device in accordance with claim 8, wherein the masking means further comprise two adjustable stops limiting movement of said displacement means and said displacement means are coupled to the plate-shaped mask element.

10. The device in accordance with claim 8, wherein the plate-shaped mask element is releasably connected with the cylindrical cooling housing.

11. The device in accordance with claim 8, wherein the device has a longitudinal center axis (58) and the plate-shaped mask element is disposed concentrically with the longitudinal center axis and is releasably connected with the cylindrical cooling housing.

12. The device in accordance with claim 1, wherein the masking means further comprise at least one stop limiting movement of said displacement means and said device further comprises a cylindrical cooling housing (61) releasably connected to the center mask guide element.

13. The device in accordance with claim 1, wherein the masking means further comprise two stops limiting movement of the center mask guide element.

14. The device in accordance with claim 13, wherein the two stops are adjustable.

15. The device in accordance with claim 13, wherein the two stops are coupled to the center mask guide element.

16. The device in accordance with claim 13, further comprising a cantilever arm (63) which receives the center mask guide element and wherein the two stops are on the cantilever arm.

17. The device in accordance with claim 1 wherein said displacement means have an initial position in which the masks are arranged at a distance from the surface of the substrate and the center mask protrudes relative to the outer mask in such a way that the center mask comes to rest on the surface of the substrate when the substrate is moved toward the center.

18. The device in accordance with claim 1, wherein at least a part of one of the masks is releasably connected in the device.

19. The device in accordance with claim 1, wherein said displacement means are operative for causing both of said masks to rest on the surface of the substrate with approximately equal contact pressure.

20. The device in accordance with claim 1, further comprising a cantilever arm (63) which receives the center mask guide element, and wherein at least one of the center mask guide element and the cantilever arm is disposed in a chamber that is continuously under atmospheric pressure.

* * * * *

UNITED STATES PATENT AND TRADEMARK OFFICE
CERTIFICATE OF CORRECTION

PATENT NO. : 5,800,687
DATED : September 1, 1998
INVENTOR(S) : KEMPF

It is certified that error appears in the above-identified patent and that said Letters Patent is hereby corrected as shown below:

On the title page, insert the following item:

[30]   Foreign Application Priority Data

Apr. 13, 1996  [DE] Germany .....................................19614600.3

Signed and Sealed this

Ninth Day of January, 2001

Attest:

Q. TODD DICKINSON

*Attesting Officer*     *Commissioner of Patents and Trademarks*